(12) United States Patent
Zwinkels

(10) Patent No.: US 9,615,489 B2
(45) Date of Patent: Apr. 4, 2017

(54) ARRANGEMENT FOR PROVIDING AIR TO A ROOM

(71) Applicant: EvoSwitch IP B.V., Haarlem (NL)

(72) Inventor: Cornelis Albert Zwinkels, Haarlem (NL)

(73) Assignee: EvoSwitch IP B.V., Haarlem (NL)

( * ) Notice: Subject to any disclaimer, the term of this patent is extended or adjusted under 35 U.S.C. 154(b) by 744 days.

(21) Appl. No.: 13/935,769

(22) Filed: Jul. 5, 2013

(65) Prior Publication Data
US 2015/0011148 A1    Jan. 8, 2015

(51) Int. Cl.
H05K 5/00 (2006.01)
H05K 7/20 (2006.01)

(52) U.S. Cl.
CPC ..... H05K 7/20836 (2013.01); H05K 7/20745 (2013.01)

(58) Field of Classification Search
CPC ............... F24F 2011/0002; H05K 7/20745
See application file for complete search history.

(56) References Cited

U.S. PATENT DOCUMENTS

| | | | | |
|---|---|---|---|---|
| 4,841,733 A * | 6/1989 | Dussault | ............... | F24F 5/0071 165/223 |
| 6,209,622 B1 * | 4/2001 | Lagace | ................. | F24F 3/1423 165/54 |
| 8,151,578 B1 * | 4/2012 | Morales | ................ | F24F 3/0442 62/259.2 |
| 9,032,742 B2 * | 5/2015 | Dunnavant | ........... | F24F 12/006 62/259.2 |
| 2004/0000152 A1 * | 1/2004 | Fischer | ................. | F24F 3/1423 62/94 |
| 2009/0210096 A1 * | 8/2009 | Stack | ................... | F24F 11/0009 700/278 |
| 2010/0027216 A1 * | 2/2010 | Matsushima | ...... | H05K 7/20745 361/679.49 |

(Continued)

FOREIGN PATENT DOCUMENTS

DE    4243429 A1    6/1994
DE    202009002033 U1    6/2009

(Continued)

OTHER PUBLICATIONS

European Search Report dated Jan. 16, 2013.

*Primary Examiner* — Steven B McAllister
*Assistant Examiner* — Jonathan Cotov
(74) *Attorney, Agent, or Firm* — Nath, Goldberg & Meyer; Jerald L. Meyer; Christopher Thomas

(57) ABSTRACT

The invention relates to an arrangement for providing air to a room is provided. The arrangement comprises a first inlet for taking in air from the room, a first outlet for providing air to the room, a second inlet for taking in air from a space other than the room, the second inlet being connected to the first outlet and a second outlet for exhausting air to the space other than the room; the second outlet being connected to the first inlet. The arrangement further comprises a cooling duct connecting the first inlet and the first outlet, the cooling duct having a cooling module disposed therein for cooling air in the duct and a first flow control module for controlling a first airflow ratio between an exhaust airflow flowing from the first inlet to the second outlet and a cooling airflow from the first inlet to the first outlet.

14 Claims, 4 Drawing Sheets

(56) References Cited

U.S. PATENT DOCUMENTS

| | | | | |
|---|---|---|---|---|
| 2010/0154448 A1* | 6/2010 | Hay | ............................ | G06F 1/20 62/175 |
| 2010/0263830 A1* | 10/2010 | Noteboom | ............ | H05K 7/2079 165/80.2 |
| 2011/0239683 A1* | 10/2011 | Czamara | ............ | H05K 7/20745 62/259.4 |
| 2012/0006038 A1* | 1/2012 | Sharma | .............. | H05K 7/20745 62/97 |
| 2012/0167600 A1* | 7/2012 | Dunnavant | ........... | F24F 12/006 62/89 |
| 2012/0216558 A1* | 8/2012 | Dempsey | .............. | F24F 12/003 62/238.7 |
| 2012/0298334 A1* | 11/2012 | Madaffari | .......... | H05K 7/20745 165/104.13 |

FOREIGN PATENT DOCUMENTS

| | | | |
|---|---|---|---|
| GB | 2480477 | A | 11/2011 |
| WO | 9924762 | A1 | 5/1999 |
| WO | 2010009626 | A1 | 1/2010 |
| WO | 2012006436 | A2 | 1/2012 |
| WO | 2012099464 | A1 | 7/2012 |

* cited by examiner

ARRANGEMENT FOR PROVIDING AIR TO A ROOM

TECHNICAL FIELD

This disclosure relates to an arrangement for providing air to a room and for providing cool air to a room in a data centre.

BACKGROUND

United States patent application US 2009/0210096 discloses a data centre comprising a computer room air conditioner and an air economiser. An air economiser or outside air economiser is a system that cools a building using air from outside the building. This system is most effective when the outside air is cooler than the air inside. The air exhausted by the air economiser flows along chilled water valves and compressors of computer room air conditioners, whether the computer room air conditioners are used to the data centre or not.

SUMMARY

It is preferred to have air that does not need to be cooled not flowing along a cooling unit.

In a first aspect, an arrangement for providing air to a room is provided. The arrangement comprises a first inlet for taking in air from the room, a first outlet for providing air to the room, a second inlet for taking in air from a space other than the room, the second inlet being connected to the first outlet and a second outlet for exhausting air to the space other than the room; the second outlet being connected to the first inlet. The arrangement further comprises a cooling duct connecting the first inlet and the first outlet, the cooling duct having a cooling module disposed therein for cooling air in the duct and a first flow control module for controlling a first airflow ratio between an exhaust airflow flowing from the first inlet to the second outlet and a cooling airflow from the first inlet to the first outlet.

Air is provided to the room via the first outlet. The air is provided to the first outlet via the second inlet and/or via the cooling duct. Air provided via the cooling duct is recirculated air from the room, taken in by the arrangement via the first inlet. Air is taken from the room via the first inlet and subsequently exhausted via the second outlet or cooled via the cooling module in the cooling duct and provided to the room again. In this way, the room is provided with cooled air that is recirculated to the room and/or air from a space other than the room. This allows the room to be cooled with air from a space other than the room, recirculated and cooled air or both. And only air that needs to be actively cooled is guided through the cooling duct via the first flow control module; air that is already cool enough or otherwise has appropriate parameters is provided directly to the room.

In an embodiment of the first aspect, the first flow control module comprises a first valve disposed between the first inlet and the second outlet and a second valve disposed between the first inlet and the cooling module.

By providing the first flow control module with two valves at appropriate locations, the flows to the space other than the room and through the cooling duct can be well controlled.

In a further embodiment of the first aspect, the operation of the first valve and the second valve is coupled such that a first opening ratio of the first valve is inversely proportional to a second opening ratio of the second valve.

With coupling between operations of the first valve and the second valve, the ratio between the cooling airflow and an airflow from the space other than the room can be controlled, both airflows being provided to the room. With the airflows having different temperatures, this embodiment enables smooth control of the temperature of air provided to the room, while keeping the total flow rate at the same magnitude with other parameters being substantially constant.

In another embodiment of the first aspect, the cooling module is an indirect evaporative cooling module disposed in the cooling duct such that air flowing through the cooling duct is a secondary airflow through the cooling module, the arrangement further comprising an evaporation duct for providing a primary airflow through the cooling module, the evaporation duct connecting the second inlet and the second outlet.

Indirect evaporative cooling is an efficient type of cooling, in particular as it has no moving parts by itself that require to be driven while supplying energy for the driving. By using air from the space other than the room as primary airflow for the indirect evaporative cooling module, airflows from and to the room are not influenced by the amount of air required for effective evaporative cooling. Furthermore, process air in which a liquid is evaporated is not provided to the room. This is an advantage, as such humid air may interfere with any equipment in the room.

In yet a further embodiment of the first aspect, the second flow control module comprising a third valve between the second inlet and the first outlet and a fourth valve between the second inlet and the evaporation duct.

By providing the second flow control module with two valves at appropriate locations, the flows from the space other than the room and through the evaporation duct can be well controlled.

In yet another embodiment of the first aspect, the operation of the first valve, the second valve, the third valve and the fourth valve is coupled such that the first opening ratio is substantially equal to the third opening ratio and the second opening ratio is substantially equal to the fourth opening ratio.

By coupling operations of the various valves, a proper pressure balance is maintained in the room.

Again a further embodiment of the first aspect comprises a processing unit for controlling the operation of components of the arrangement. The processing unit is coupled to a temperature sensor for sensing the temperature of air in the space other than the room and the processing unit is arranged operate the first flow control module such that if the temperature sensed is below a first temperature value, the cooling airflow is disabled, if the temperature sensed is between the first temperature value and a second temperature value being higher than the first temperature value, the exhaust airflow and the cooling airflow are enabled and if the temperature sensed is above the second temperature value, the exhaust airflow is disabled.

This embodiment allows smooth and continuous control of the temperature of air provided to the room.

A second aspect provides a serving housing module as a room for housing data cabinets arranged for housing data servers and further comprising the cooling system according to the first aspect for providing for providing an airflow to the serving housing module via the first outlet for cooling the data servers.

BRIEF DESCRIPTION OF THE DRAWINGS

FIG. 3 B: shows a cooling system in active cooling mode

FIG. 5 B: shows a cooling system comprising an indirect evaporative cooling element in active cooling mode.

DETAILED DESCRIPTION

Figure 1:
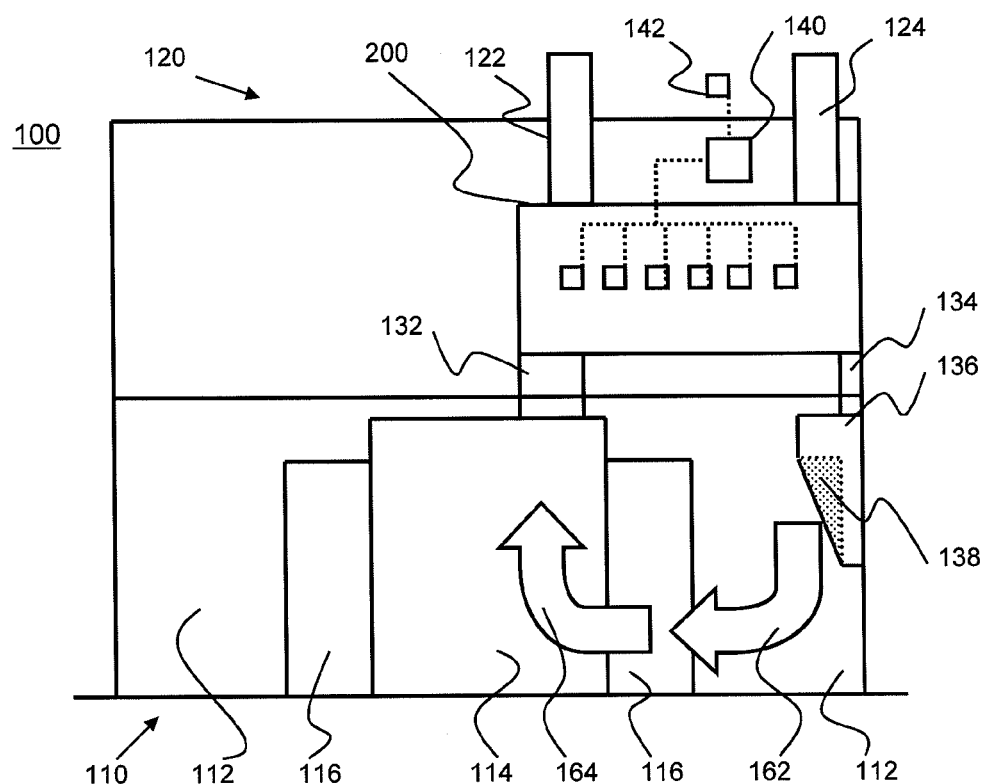
FIG. 1: shows a data centre.

FIG. 1 shows a data centre 100 comprising a server housing module 110 and a cooling housing module 120. The server housing module 110 is compartmentalised in two side corridors 112 and a middle corridor 114. Between the middle corridor 114 and the two side corridors data cabinets 116 for housing servers are provided on either side of the middle corridor 114.

The cooling housing module 120 comprises a cooling unit 200 for cooling air. The cooling unit 200 takes in air from the server housing module 110 via a data room intake duct 132. The cooling unit 200 also takes in air from a source other than the server housing module 110, in this embodiment in particular from outside, via an outside intake duct 122. The cooling unit 200 exhausts air to the server housing module 110 and in particular the right side corridor 112 via a data room exhaust duct 134. The cooling unit 200 is also arranged to exhaust air to the outside via an outside exhaust duct 124. The data room exhaust duct 134 is coupled to an optional data room diffuser plenum 136 comprising a diffuser medium 138. The operation of the cooling unit 200 is controlled by a controlling unit 140 coupled to the cooling unit 200. The controlling unit 140 is coupled to an outside temperature sensor 142.

In operation, the cooling unit 200 exhausts cool air in the right side corridor 112 through the data room diffuser plenum 136. The exhausted air flows through the servers in the data cabinets 116; this flow is indicated by a first arrow 162. It is noted that this flow is at least aided by fan units available in servers housed in the data cabinets 116. The air is heated by heat dissipated by the servers. The cooling unit 200 takes in air from the middle corridor 114 via the data room intake duct 132, establishing an air flow through the servers as indicated by the second arrow 164. In this way, a circular air flow is established from the cooling unit 200, through the right side corridor 112, the right data cabinet 116, the middle corridor 114, back to the cooling unit 200.

As air cooled by the cooling unit 200 is exhausted in the right side corridor 112, the temperature in the right side corridor is relatively cool. Analogously, the air flowing into the middle corridor 114 is relatively high as it is heated up by the server in the data cabinet 116. This means that the airflow from the data room diffuser plenum 136 flowing via the data cabinets 116 towards the data room intake duct 132 is at least partially provided by means of convection. Cool air exhausted via the data room diffuser plenum 136 drops in the right side corridor 112 and air heated by the servers in the data cabinets 116 rises in the middle corridor 114 towards the data room intake duct 132. Because of this convection, the server housing module 110 does not necessarily have to be compartmentalised to enable cooling and airflow. However, compartmentalisation is preferred to prevent cool air exhausted by the cooling unit 200 via the data room diffuser plenum 136 being taken in without having flown through the servers in the data cabinets 116, as this would lead to less efficient cooling operation in the server housing module 110.

Analogous to cooled air being provided to the right side corridor 112, also cool air is provided to the left side corridor 112 for cooling servers in the left data cabinets 116. For reasons of clarity, details on cooling of the left data cabinets 116 have been omitted in FIG. 1.

Figure 2:
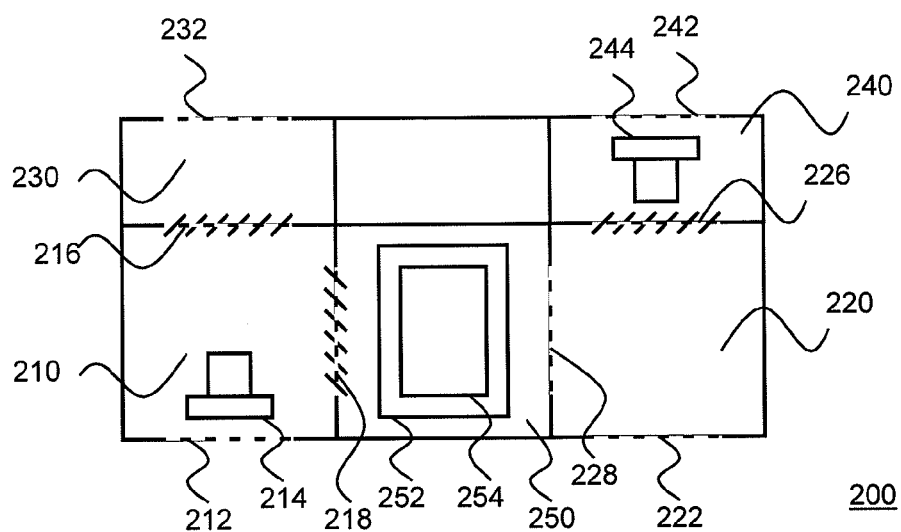
FIG. 2: shows a cooling system.

FIG. 2 shows the cooling unit 200 in further detail. The cooling unit 200 comprises a first inlet duct 210, a first outlet duct 220, a second outlet duct 230, a second inlet duct 240 and a cooling duct 250.

The first inlet duct 210 comprises a first inlet 212 for taking in air from the middle corridor 114 (FIG. 1) and a first fan 214 as an air displacement module. The first inlet duct 210 is connected to the second outlet duct 230 via a first damper 216. The first inlet duct 210 is connected to the cooling duct 250 via a second damper 218. As an alternative to dampers, also other air flow control modules and in particular other modules for controlling magnitude of an airflow may be used.

The first outlet duct 220 comprises a first outlet 222 for providing air to the right side corridor 112. The first outlet duct 220 is connected to the second inlet duct 240 via a third damper 226. The first outlet duct 220 is connected to the cooling duct 250 via a cooling outlet opening 226.

The cooling duct 250 comprises a cooling module 252. The cooling module 252 comprises in this embodiment a direct expansion cooling element 254. As will become apparent in the description below, also other cooling methods may be used.

The second outlet duct 230 comprises a second outlet 232 for exhausting air from the server housing module 110 (FIG. 1) to outside. The second inlet duct 240 comprises a second inlet 242 and a second fan 244.

Figure 3:
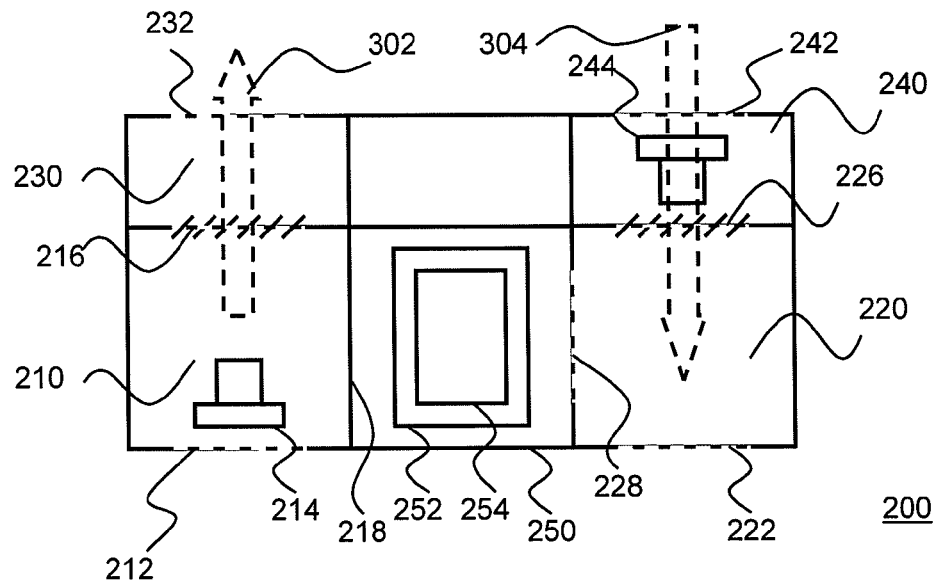
FIG. 3 A: shows a cooling system in ambient air cooling mode.
Figure 3:
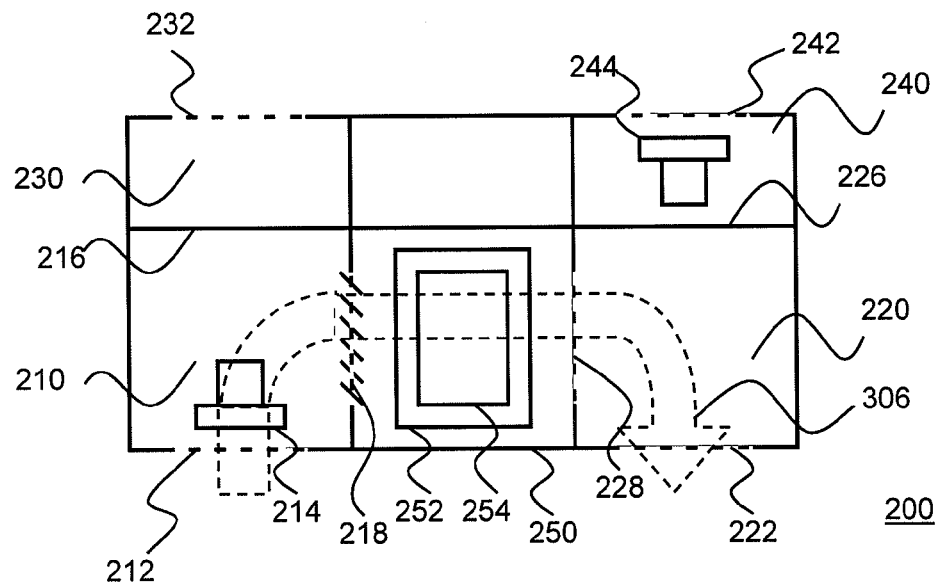

Operation of the cooling unit 200 will now be discussed in conjunction with FIG. 3 A and FIG. 3 B. FIG. 3 A shows the cooling unit 200 in ambient air cooling mode. In ambient air cooling mode, the first damper 216 is open and preferably fully open. The second damper 218 is closed to prevent air flowing to the cooling duct 250 and through the cooling module 252. The first fan 214 is operational, generating an outflowing airflow 302 exhausted by the cooling system 200 via the second outlet as an exhaust airflow 308.

In the ambient air cooling mode, the third damper 226 is open and preferably fully open. The second fan 244 is operational, generating an intake airflow 304 flowing through the first outlet duct 220 as an inlet airflow. The second fan 244 is optional, as an airflow through the data centre 100 is already present due to convection, as already discussed.

Furthermore, an airflow caused by the convection is also aided by fan in data equipment and/or the first fan 214. Hence, air will also be drawn by the right side corridor 112.

FIG. 3 B shows the cooling unit in active cooling mode. In active cooling mode, the first damper 216 is closed. The second damper 218 is open and preferably fully open, enabling air taken in via the first inlet 212 by means of the first fan 214 to flow through the cooling duct 250, along the cooling module 242. In this way, a cooling airflow 306 is generated through the cooling duct 250. In the active cooling mode, the third damper 226 is preferably closed. In this way, air cooled in by the cooling module 252 cannot escape to the outside via the second outlet 242. However, the third damper 226 is not necessary for this: as there will be a certain underpressure in the right side corridor 112 due to convection in the server housing module 110 (FIG. 1), the cooling airflow will at least almost fully flow out of the cooling system 200 via the first outlet 222 rather than via the second outlet 242.

If the ambient temperature outside the data centre 100 is low enough to cool the equipment housed by the data centre 100, the equipment is cooled by the cooling system 200 in the mode as depicted by FIG. 3 A. If the ambient temperature outside the data centre 100 is too high for cooling the equipment of the data centre 100, the cooling system 200 operates in the mode as depicted by FIG. 3 B.

In one embodiment, the cooling system 200 operates in the mode as depicted by FIG. 3 A if the outside temperature is below 18° C. as a first temperature threshold and in the mode depicted by FIG. 3 B if the outside temperature is above 24° C. as a second temperature threshold. In the range between these temperatures, the cooling system 200 works in a hybrid mode, which is a mix of both operating modes discussed above.

In the hybrid mode, both the first damper 216 and the second damper 218 are open, as well as the third damper 226. A first airflow ratio in an inflowing airflow at the first inlet 212 between on one side an exhaust airflow 308 at the second outlet 232 and on another side the cooling airflow 306 is controlled by controlling the opening ratios of the dampers. If a damper is fully open, the opening ratio is 1. If a damper is closed, the opening ratio is 0. If a damper is open such to pass through half the airflow that it is enabled to pass through when the damper is fully open, the opening ratio may be defined at 0.5.

Hence, the first airflow ratio between the exhaust airflow 308 and the cooling airflow 306 is determined by the opening ratios of the first damper 216 and the second damper 218. If both dampers have the same opening ratio, the first airflow ratio is 1. In this way, the first damper 216 and the second damper 218 operate as a flow control module controlling the first airflow ratio.

In the hybrid more, the first fan 214 controls the total amount of air taken in by the cooling system 200 from the middle corridor 114 (FIG. 1) and the ratio of opening ratios of the first damper 216 and the second damper 218 controls the first airflow ratio. At the first outlet duct 220, an outlet airflow is provided to the right side corridor 112 via the first outlet. This outlet airflow is a sum of the cooling airflow 306 and the intake inflow 304. A second airflow ratio of the cooling airflow 306 and the intake airflow 304 is a factor that influences the temperature of the outlet airflow. As one component of the outlet airflow is the cooling airflow 406, the second airflow ratio is among others controlled by the second damper 218. The intake airflow 304 is controlled by means of the third damper 226 and the second fan 244.

Preferably, the second fan 244 controls the intake airflow 304 is substantially equal to the exhaust airflow 308 for a proper pressure balance in the server housing module 110. In another embodiment, the intake airflow 304 is controlled to be slightly higher than the exhaust airflow 308 to generate a slight overpressure in the right corridor 112. With this overpressure, pollutions from outside the data centre 100 are kept outside.

In a preferred embodiment, operations of the first damper 216 and the third damper 226 are coupled such that their opening ratios are substantially equal to maintain the proper pressure balance as discussed above. Additionally or alternatively, the operations of the first damper 216 and the second damper 218 are coupled such that the opening ratio of the first damper 216 is inversely proportionally to the opening ratio of the second damper 218. This can be done either electronically via the controlling unit 140 (FIG. 1) or mechanically by actually mechanically coupling moving parts of the first damper with moving parts of the second damper 218 such that movements of the first damper 216 are transferred to the second damper 218 and vice versa. With speeds or air displacement performances of the first fan 214 and the second fan 244 at substantially equal levels, this ensures that the pressure balance is properly kept.

As indicated, the opening ratios of the various dampers control the temperature of the inflow air, as well as the temperature of ambient air taken in from outside. Therefore, the opening ratios of the dampers is preferably coupled to the temperature of the ambient air taken in from outside. In particular, the opening ratio of the first damper 216 is equal to one minus a ratio of on one side the difference between the temperature of the ambient air taken in and the first temperature threshold and on the other side the difference between the second temperature threshold and the first temperature threshold. The opening ratio of the third damper 226 is substantially equal to that and the opening ratio of the second damper 218 is substantially equal to one minus the opening ratio of the first damper 216. In this way, the temperature of air taken in is smoothly controlled in operation of the cooling system 200 with an outside ambient temperature in the range between the first temperature threshold and the second temperature threshold.

Figure 4:
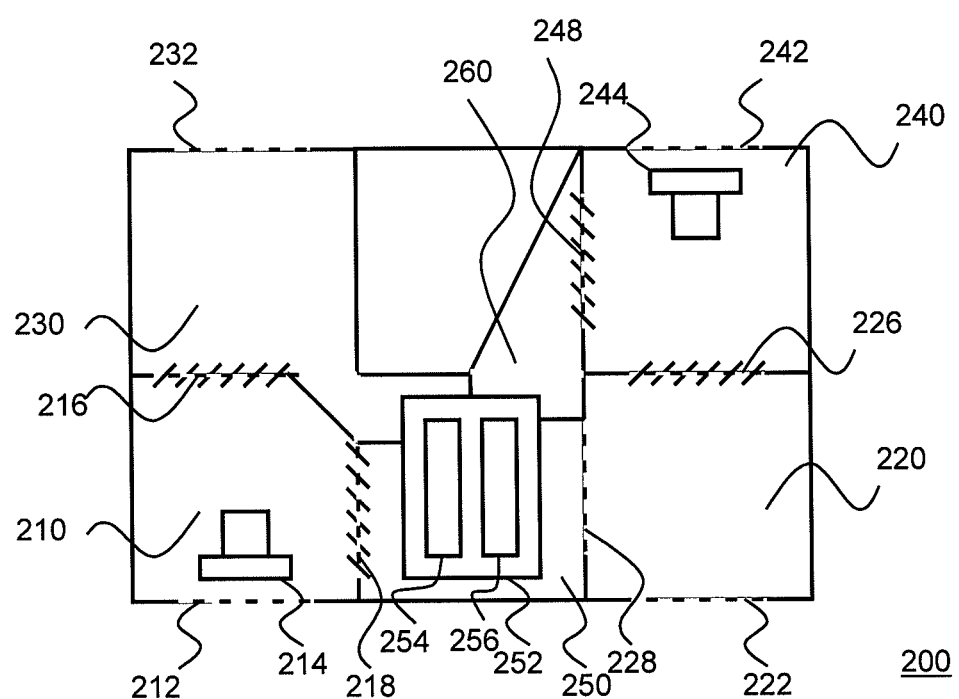
FIG. 4: shows a cooling system comprising an indirect evaporative cooling element.

FIG. 4 shows another embodiment of the cooling system 200. The cooling system 200 depicted by FIG. 4 comprises the various elements of the embodiments discussed previously, which elements have comparable functionality. Additionally, the cooling system 200 depicted by FIG. 4 further comprises, in the cooling module 252, an indirect evaporative cooling element 256 and preferably one as disclosed by international patent application WO 2005/106343 or as disclosed by international patent application WO 2007/136265. The evaporative cooling element 256 may be placed in series with the direct expansion cooling element 254, preferably upstream. Alternatively, the direct expansion cooling element 254 is replaced by the evaporative cooling element 256.

Via an evaporation duct 260, the indirect evaporative cooling element 256 is provided with a primary airflow in which liquid—preferably water—available in the indirect evaporative cooling element 256 is evaporated. The evaporation duct 260 is provided between the second inlet duct 240 and the second outlet duct 230 and between the evaporation duct 260 and the second inlet duct 240, a fourth damper 248 is provided.

Figure 5:
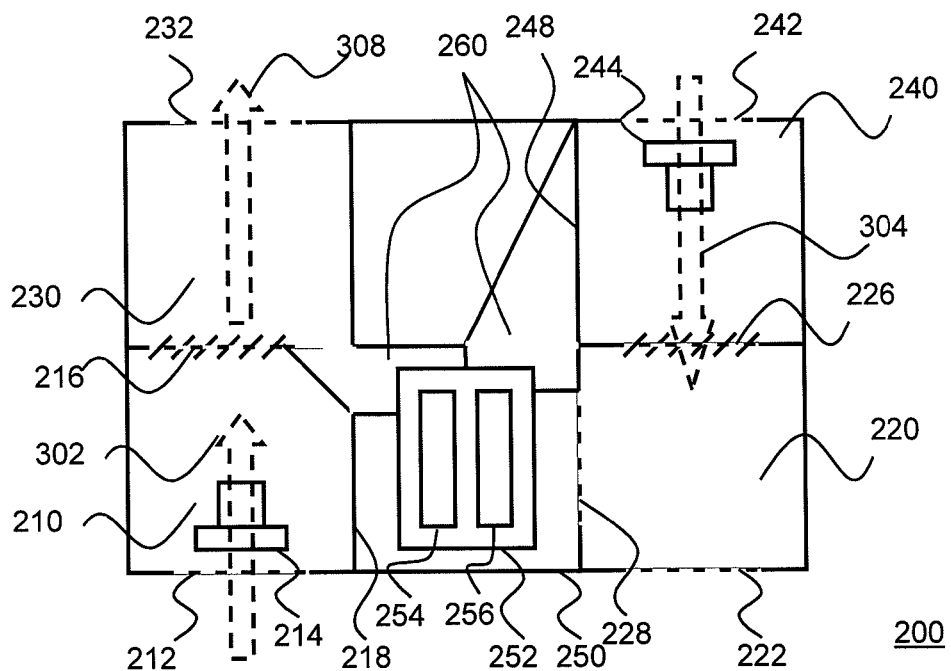
FIG. 5 A: shows a cooling system comprising an indirect evaporative cooling element in ambient air cooling mode.
Figure 5:
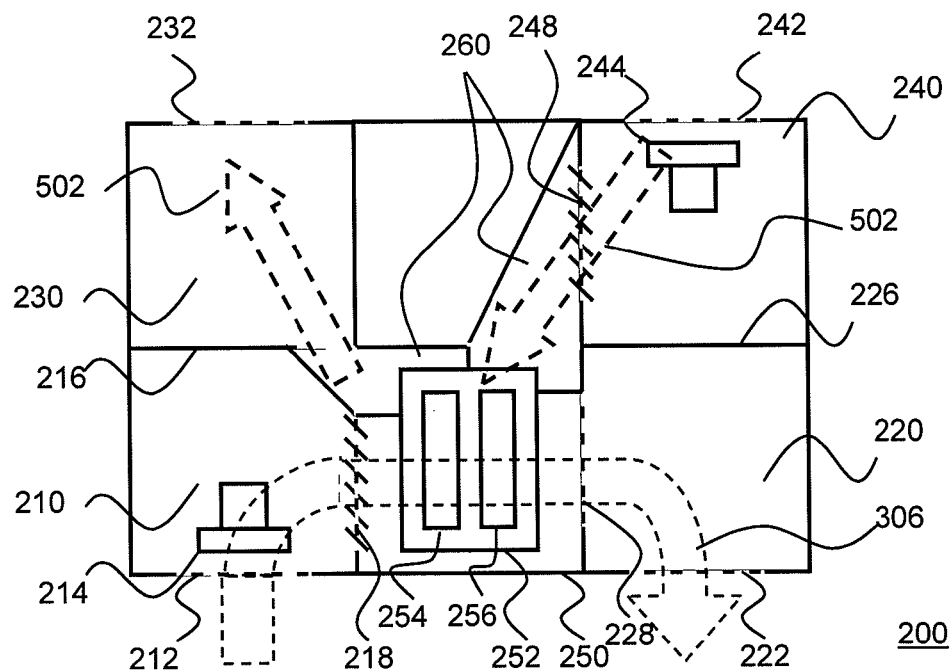

FIG. 5 A shows the cooling system 200 operating in ambient air cooling mode, equivalent to the operating mode depicted by FIG. 3 A. In ambient cooling mode, the fourth damper 248 is closed and all air taken in via the second inlet 242 is provided to the right side corridor 112 via the third damper 226 and the first outlet 222. The second fan 244 is operational, generating an intake airflow 304 flowing through the first outlet duct 220 as an inlet airflow.

FIG. 5 B shows the cooling system 200 in active cooling mode, equivalent to the operating mode depicted by FIG. 3 B. In addition to the operation depicted by FIG. 3 B, the fourth damper 248 is opened to enable a primary airflow 502 through the evaporation duct 260 for evaporating liquid in the indirect evaporative cooling element 256. The evaporation of liquid in the indirect evaporative cooling element 256 results in cooling of the indirect evaporative cooling element 256, enabling it to cool the cooling airflow flowing through the cooling duct 250.

The cooling system depicted by FIG. 4 is also arranged to operate in hybrid mode, as discussed above. A difference of the embodiment shown by FIG. 4 with respect to the embodiment shows by FIG. 2 is that in hybrid mode with the second inlet 242 air is taken in both for an evaporation airflow 502 through the evaporation duct 260 and for the outlet airflow 304 through the first outlet 222. The total amount is controlled by the speed of the second fan 244. A second airflow ratio of the evaporation airflow 502 and the outlet airflow 304 is controlled by the opening ratios of the third damper 226 and the fourth damper 248.

It is noted that if the desired airflow ratio is around one, the total amount of air taken in via the second inlet 242 is also controlled by the individual opening ratios of the third damper 226 and the fourth damper 248. With the opening ratios of both dampers at or close to one, more air can be taken in than with the opening ratios of both dampers at or close to 10%, whereas in both cases the ratio of opening ratios of the dampers remains about one. And the ratio of the evaporation inflow 502 and the outlet airflow is also maintained at about one.

It is noted that this calculation carries the implied assumption that the ratio of airflows is directly proportional to the ratio of opening ratios. This will often be the case, but not always as secondary aspects like diameters of downstream ducts, resistance in those ducts due to bends and corners and counterpressure in a room where the downstream ducts end play a role here as well.

In hybrid cooling mode, the fourth damper 248 is preferably operated independently from operation of the third damper 226, whereas, as discussed above, operations of the first damper 216 and the second damper are preferably coupled. A reason for this is that the primary airflow 502 does not form part of any airflow provided to the server housing module 110 (FIG. 1). Alternatively, the operations of the first damper 216 and the third damper 226 are coupled as discussed before, i.e. having substantially the same opening ratio, and the operations of the second damper 218 and the fourth damper 248 are coupled in an equivalent way. Additionally or alternatively, operations of the first damper 216 and the second damper 218 are coupled as to the dampers having opening ratios inversely proportional to one another and the operations of the third damper 226 and the fourth damper 248 are coupled in an equivalent way.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

In the description above, it will be understood that when an element such as layer, region or substrate is referred to as being "on", "onto" or "connected to" another element, the element is either directly on or connected to the other element, or intervening elements may also be present.

Furthermore, the invention may also be embodied with less components than provided in the embodiments described here, wherein one component carries out multiple functions. Just as well may the invention be embodied using more elements than depicted in FIG. 1, FIG. 2 and FIG. 4, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:

1. Arrangement for providing air to a room, comprising:
a first inlet for taking in air from the room;
a first outlet for providing air to the room;
a second inlet for taking in air from a space other than the room, the second inlet being connected to the first outlet;
a second outlet for exhausting air to the space other than the room; the second outlet being connected to the first inlet;
a cooling duct connecting the first inlet and the first outlet, the cooling duct having a cooling module disposed therein for cooling air in the duct; and
a first flow control module for controlling a first airflow ratio between an exhaust airflow flowing from the first inlet to the second outlet and a cooling airflow from the first inlet to the first outlet;
wherein the cooling module is an indirect evaporative cooling module disposed in the cooling duct such that air flowing through the cooling duct is a secondary airflow through the cooling module, the arrangement further comprising an evaporation duct for providing a primary airflow through the cooling module, the evaporation duct connecting the second inlet and the second outlet.

2. Arrangement according to claim 1, further comprising a first air displacement module for generating an inflowing airflow at the first inlet, the inflowing airflow being substantially equal to a sum of the exhaust airflow and the cooling airflow.

3. Arrangement according to claim 1, further comprising a second air displacement module for generating an intake airflow at the second inlet.

4. Arrangement according to claim 1, wherein the first flow control module comprises a first valve disposed between the first inlet and the second outlet and a second valve disposed between the first inlet and the cooling module.

5. Arrangement according to claim 4, wherein the operation of the first valve and the second valve is coupled such that a first opening ratio of the first valve is inversely proportional to a second opening ratio of the second valve.

6. Arrangement according to claim 1, further comprising a second flow control module for controlling the primary airflow.

7. Arrangement according to claim 6, the second flow control module comprising a third valve between the second inlet and the first outlet and a fourth valve between the second inlet and the evaporation duct.

8. Arrangement according to claim 7, wherein the operation of the third valve and the fourth valve is coupled such that a third opening ratio of the third valve is inversely proportional to a fourth opening ratio of the fourth valve.

9. Arrangement according to claim 7, wherein the operation of the first valve, the second valve, the third valve and the fourth valve is coupled such that the first opening ratio is substantially equal to the third opening ratio and the second opening ratio is substantially equal to the fourth opening ratio.

10. Arrangement according to claim 9, further comprising a processing unit for controlling the operation of components of the arrangement, the processing unit being coupled to a temperature sensor for sensing the temperature of air in the space other than the room and the processing unit is arranged operate the first flow control module such that if the temperature sensed is below a first temperature value, the cooling airflow is disabled;

if the temperature sensed is between the first temperature value and a second temperature value being higher than the first temperature value, the exhaust airflow and the cooling airflow are enabled; and if the temperature sensed is above the second temperature value, the exhaust airflow is disabled.

11. Arrangement according to claim 10, wherein the first airflow ratio is proportional to a temperature difference between the temperature sensed and the first temperature value.

12. Arrangement according to claim 11, wherein the first airflow ratio is substantially equal to a temperature ratio that is substantially equal to the value of the temperature sensed minus the first temperature value on one side and the difference between the second temperature value and the first temperature value on another side.

13. Data centre comprising a server housing module as a room for housing data cabinets arranged for housing data servers and further comprising the arrangement according to claim 1 for providing an airflow to the serving housing module via the first outlet for cooling the data servers.

14. Data centre according to claim 13, wherein the server housing module is compartmentalised in at least a first space and a second space, wherein the data cabinets face the first space at a first side and the second space at a second side, the data cabinets being arranged for housing data servers such that air can flow from the first space to the second space through the data servers, and wherein the first outlet is coupled to the first space for providing air to the first space and the first inlet is coupled to the second space for taking in air from the second space.

\* \* \* \* \*